United States Patent

Fujii et al.

[11] Patent Number: 5,969,355
[45] Date of Patent: Oct. 19, 1999

[54] FOCUSED ION BEAM OPTICAL AXIS ADJUSTMENT METHOD AND FOCUSED ION BEAM APPARATUS

[75] Inventors: Toshiaki Fujii; Toshio Doi; Munenori Tasai; Yasuhiko Sugiyama, all of Chiba, Japan

[73] Assignee: Seiko Instruments Inc., Chiba, Japan

[21] Appl. No.: 08/923,562

[22] Filed: Sep. 4, 1997

[51] Int. Cl.[6] ................................................. H01J 37/317
[52] U.S. Cl. ............................................................ 250/309
[58] Field of Search .............................. 250/309, 492.2, 250/492.3, 492.21, 423 R, 505.1

[56] References Cited

U.S. PATENT DOCUMENTS

| | | | |
|---|---|---|---|
| 5,055,696 | 10/1991 | Haraichi et al. | 250/492.2 |
| 5,065,034 | 11/1991 | Kawanami et al. | 250/492.2 |
| 5,852,297 | 12/1998 | Ishitani et al. | 250/309 |

*Primary Examiner*—Kiet T. Nguyen
*Attorney, Agent, or Firm*—Loeb & Loeb LLP

[57] ABSTRACT

To provide a focused ion beam optical axis alignment method and a focused ion beam apparatus which make axis alignment work of for example when replacing an ion source of a focused ion beam apparatus easy. A method for adjusting the optical axis of a focused ion beam apparatus having an ion source part 3 made up of an ion source 1 for producing an ion beam and a pullout electrode 2, a monitoring aperture 5 which passes a central part having a high energy density of the ion beam and measures the electric current thereof, a charged particle optical system 9 including a condenser lens 6, an aperture 7 and an objective lens 8, and a deflecting electrode 16 which scans the focused ion beam, wherein while moving the ion source 1 in a direction intersecting orthogonally with the optical axis of the ion beam the current measured by the monitoring aperture 5 and the overall ion beam quantity produced from the ion source are monitored and a voltage impressed on the pullout electrode is controlled so that this current becomes constant and the position of the ion source 1 is adjusted so that the overall ion beam quantity becomes a minimum.

24 Claims, 5 Drawing Sheets

FOCUSED ION BEAM OPTICAL AXIS ADJUSTMENT METHOD AND FOCUSED ION BEAM APPARATUS

BACKGROUND OF THE INVENTION

This invention relates to a method of adjusting the optical axis of an ion beam in a focused ion beam apparatus and to a focused ion beam apparatus.

Conventionally, for example like the apparatus introduced in the literature Submicron Working Using Focused Ion Beam (SSD 81-76)' (Electronic Communications Society Research Group, Dec. 21, 1981), focused ion beam apparatuses have been known which, after constricting an ion beam produced from a liquid metal ion source such as Gallium with a fixed stop, to obtain beam current and diameter over a wide range, constrict the ion beam further by means of a stop having a plurality of different openings and made so that it is possible to select these arbitrarily, focus it into a spot shape with an objective lens, raster scan radiate it using a scanning electrode and carry out working of a sample surface. Also, they are provided with an image display device for displaying a pattern of the sample surface on the basis of the plane strength distribution of secondary charged particles emitted from the sample surface irradiated with the ion beam.

In this kind of focused ion beam apparatus, to make it fully exhibit its performance, it is considered necessary to make it so that the ion beam passes through the centers of ion optical system parts such as a stop, a lens and a deflecting electrode. To achieve this, the performance as an apparatus has been realized by performing highly accurate machining in making the parts and paying close attention to assembly.

However, because the ion source is consumed with use of the focused ion beam apparatus, it is necessary to replace it when required, but at the time of replacement the ion beam produced from the new ion source does not always pass through the centers of the ion optical system parts. Because of this, it is necessary to adjust the position of the ion beam so that it passes through the centers of the ion optical system parts.

Also, because a stop having a plurality of different openings and made so that these can be selected arbitrarily wears and stains with use of the focused ion beam apparatus, it must be replaced periodically. At the time of this replacement, because a position misalignment between the center of the new stop and the ion beam arises, it is necessary to carry out that adjustment.

That is, conventionally, when the ion source has been replaced, for example as shown in the apparatus described in Japanese Unexamined Patent Publication No. H.3-29249, the ion source is mounted on an X-Y stage and the position of the ion source is adjusted by driving this X-Y stage. However, in this case, the position misalignment is adjusted with the ion source attachment position being checked visually with a CRT monitor, and there is no mention of a method with which it is possible to determine that the ion beam produced from the ion source is passing through the centers of the ion source optical system parts. Also, as another example, as described in Japanese Unexamined Utility Model Publication No. S.59-47960, there is an apparatus wherein a second anode part is provided movably in a horizontal direction and a driving mechanism for driving this second anode part in the horizontal direction is provided. This is an apparatus relating to an electron gun, but it can also be utilized in relation to an ion source. However, in this example also, there is no mention relating to how it is possible to determine that the beam is passing through the centers of the optical system parts.

Consequently, conventionally, adjustment of position has been realized by making it converge on the target position by carrying out the operation repeatedly, and the degree of achievement of that adjustment and the time required for the operation depend on the skill of the worker. Also, because the parameters relating to the adjustment have not been quantified, it cannot be carried out automated with a computer.

As one solution method for this kind of position adjustment, there is the method described in Japanese Unexamined Patent Publication No. S.61-88437. However, because due to the fact that the structure thereof is complex and that there are multiple transmission holes the ion beam and secondarily produced particles pass through these multiple transmission holes and become noise components, it becomes difficult to realize the performance of image quality and resolving power and the like sought in a focused ion beam apparatus.

On the other hand, the effect of using a stop having a plurality of different openings is shown in the above-mentioned literature Submicron Working Using Focused Ion Beam', and also, in connection with a method of selecting an optimum opening from the different openings, one is described in Japanese Unexamined Patent Publication No. H.3-163741, but a method for aligning the center of the opening with the ion beam is not mentioned in either. Therefore, like the position adjustment of the ion source, because the position adjustment is realized by making it converge on the target position by carrying out the operation repeatedly, the degree of achievement of that adjustment and the time required for the operation depend on the skill of the worker. Also, because the parameters relating to the adjustment have not been quantified, it cannot be carried out automated with a computer.

SUMMARY OF THE INVENTION

This invention, in view of this kind of situation, makes its problem providing a focused ion beam optical axis alignment method and a focused ion beam apparatus which make easy the axis alignment work of times such as when replacing an ion source or a stop of a focused ion beam apparatus.

A first form of the invention solving the above-mentioned problem is in a method of adjusting the optical axis of a focused ion beam apparatus having an ion source part made up of an ion source for producing an ion beam and a pullout electrode, a monitoring aperture which passes a central part having a high energy density of the ion beam and measures the beam current of the caught ion beam, a charged particle optical system which includes a condenser lens, an aperture and an objective lens and makes the ion beam having passed through the monitoring aperture a focused ion beam, and a deflecting electrode which scans the focused ion beam, characterized in that while the ion source is moved in a direction intersecting orthogonally with the optical axis of the ion beam the current measured by the monitoring aperture and the overall ion beam quantity produced from the ion source are monitored and a voltage impressed on the pullout electrode is controlled so that this current becomes constant and the position of the ion source is adjusted so that the overall ion beam quantity becomes a minimum.

In this first form, while the ion source is moved, the voltage impressed on the pullout electrode is controlled so that the measured value of the beam current of the ion beam caught by the monitoring aperture becomes constant and the movement of the ion source is controlled so that the overall ion beam quantity becomes an minimum. When this kind of control is carried out, a largest ion beam with which the overall ion beam quantity is smallest passes through the monitoring aperture; in other words, the center of the beam current density of the ion beam produced from the ion source coincides with the center of the transmitting hole of the monitoring aperture.

A second form of the invention is in a method of adjusting the optical axis of a focused ion beam apparatus having an ion source part having an ion source for producing an ion beam and a pullout electrode, a monitoring aperture which passes a central part having a high energy density of the ion beam and measures the current thereof, a charged particle optical system which includes a condenser lens, an aperture and an objective lens and makes the ion beam having passed through the monitoring aperture a focused ion beam, a deflecting electrode which scans the focused ion beam, and a Faraday cup which catches the focused ion beam and measures the beam current of that focused ion beam, characterized in that while the aperture is moved in a direction intersecting orthogonally with the optical axis of the ion beam the current measured by the Faraday cup is monitored and the position of the aperture is adjusted so that this current becomes a maximum.

In this second form, while the aperture is moved, control is carried out so that the measured value of the beam current of the ion beam caught by the Faraday cup (the probe current) becomes a maximum. When this kind of control is carried out, the center of the focused ion beam emitted through the transmitting hole of the monitoring aperture and focused by the charged particle optical system and the center of the transmitting hole of the aperture coincide.

A third form of the invention is in an optical axis adjustment method according to the second form, characterized in that the dimension of a transmitting hole of the aperture for passing the ion beam is changeable and positional adjustment of the aperture is carried out for a transmitting hole of each dimension.

By this means it is possible to realize optical axis alignment for each diameter of transmitting hole of the aperture, and even when the transmitting hole of the aperture has been changed an optical axis misalignment does not occur.

A fourth form of the invention is in a method of adjusting the optical axis of a focused ion beam apparatus having an ion source part having an ion source for producing an ion beam and a pullout electrode, a monitoring aperture which passes a central part having a high energy density of the ion beam and measures the current thereof, a charged particle optical system which includes a condenser lens, an aperture and an objective lens and makes the ion beam having passed through the monitoring aperture a focused ion beam, a deflecting electrode which scans the focused ion beam, and a Faraday cup which catches the focused ion beam and measures the beam current of that focused ion beam, characterized in that it comprises a step of, while moving the ion source in a direction intersecting orthogonally with the optical axis of the ion beam, monitoring the current measured by the monitoring aperture and the overall ion beam quantity that the ion source produces and controlling a voltage impressed on the pullout electrode so that this current becomes constant and adjusting the position of the ion source so that this overall ion beam becomes a minimum and a step of, while moving the aperture in a direction intersecting orthogonally with the optical axis of the ion beam, monitoring the current measured by the Faraday cup and adjusting the position of the aperture so that this current becomes a maximum.

In this fourth form, a largest ion beam with which the overall ion beam quantity is smallest passes through the monitoring aperture; in other words, the center of the beam current density of the ion beam produced from the ion source coincides with the center of the transmitting hole of the monitoring aperture, and also, the center of the focused ion beam emitted through the transmitting hole of the monitoring aperture and focused by the charged particle optical system and the center of the transmitting hole of the aperture coincide.

A fifth form of the invention is in a method according to the fourth form, characterized in that the dimension of a transmitting hole of the aperture for passing the ion beam is changeable and positional adjustment of the aperture is carried out for a transmitting hole of each dimension.

By this means it is possible to realize optical axis alignment for each diameter of transmitting hole of the aperture, and even when the transmitting hole of the aperture has been changed an optical axis misalignment does not occur.

A sixth form of the invention is in a method of adjusting the optical axis of a focused ion beam apparatus having an ion source and a pullout electrode for producing an ion beam, a charged particle optical system which includes a condenser lens, an aperture and an objective lens and makes the ion beam a focused ion beam, a deflecting electrode which scans the focused ion beam, a fixed aperture which is disposed anywhere between the source part and the deflecting electrode and passes at least a central part having a high energy density of the ion beam or the focused ion beam, and a Faraday cup which catches the focused ion beam and measures the beam current of that focused ion beam, characterized in that while the ion source is moved in a direction intersecting orthogonally with the optical axis of the ion beam the current measured by the Faraday cup is monitored and the position of the ion source is adjusted so that this current becomes a maximum.

In this sixth form, while the ion source is moved, control is carried out so that the measured value of the beam current of the ion beam caught by the Faraday cup (the probe current) becomes a maximum. When this kind of control is carried out, a central part having a high energy density of the ion beam produced from the ion source and the center of the charged particle optical system can be made to coincide.

A seventh form of the invention is in a method of adjusting the optical axis of a focused ion beam apparatus having an ion source part having an ion source and a pullout electrode for producing an ion beam, a charged particle optical system which includes a condenser lens, an aperture and an objective lens and makes the ion beam a focused ion beam, a deflecting electrode which scans the focused ion beam, a Faraday cup which catches the focused ion beam and measures the beam current of that focused ion beam, and a fixed aperture which is disposed anywhere between the ion source part and the deflecting electrode and passes at least a central part having a high energy density of the ion beam or the focused ion beam, characterized in that while the aperture is moved in a direction intersecting orthogonally with the optical axis of the ion beam the current measured by the Faraday cup is monitored and the position of the aperture is adjusted so that this current becomes a maximum.

In this seventh form, while the aperture is moved, control is carried out so that the measured value of the beam current of the ion beam caught by the Faraday cup (the probe current) becomes a maximum. When this kind of control is carried out, the center of the focused ion beam focused by the charged particle optical system and the center of the transmitting hole of the aperture coincide.

An eighth form of the invention is in an optical axis adjustment method according to the seventh form, characterized in that the dimension of a transmitting hole of the aperture for passing the ion beam is changeable and positional adjustment of the aperture is carried out for a transmitting hole of each dimension.

By this means it is possible to realize optical axis alignment for each diameter of transmitting hole of the aperture, and even when the transmitting hole of the aperture has been changed an optical axis misalignment does not occur.

A ninth form of the invention is in a method of adjusting the optical axis of a focused ion beam apparatus having an ion source part having an ion source and a pullout electrode for producing an ion beam, a charged particle optical system which includes a condenser lens, an aperture and an objective lens and makes the ion beam a focused ion beam, a deflecting electrode which scans the focused ion beam, a fixed aperture which is disposed anywhere between the ion source part and the deflecting electrode and passes at least a central part having a high energy density of the ion beam or the focused ion beam, and a Faraday cup which catches the focused ion beam and measures the beam current of that focused ion beam, characterized in that while the ion source is moved in a direction intersecting orthogonally with the optical axis of the ion beam the current measured by the Faraday cup is monitored and the position of the ion source is adjusted so that this current becomes a maximum and while the aperture is moved in a direction intersecting orthogonally with the optical axis of the ion beam the current measured by the Faraday cup is monitored and the position of the aperture is adjusted so that this current becomes a maximum.

In this ninth form, while the ion source is moved, control is carried out so that the beam current of the ion beam caught by the Faraday cup (the probe current) becomes a maximum, and also, while the aperture is moved, control is carried out so that the measured value of the beam current of the ion beam caught by the Faraday cup becomes a maximum. When this kind of control is carried out, a central part having a high energy density of the ion beam produced from the ion source and the center of the charged particle optical system including the aperture coincide.

A tenth form of the invention is in an optical axis adjustment method according to the ninth form, characterized in that the diameter of a transmitting hole of the aperture for passing the ion beam is changeable and positional adjustment of the aperture is carried out for a transmitting hole of each dimension.

By this means it is possible to realize optical axis alignment for each diameter of transmitting hole of the aperture, and even when the transmitting hole of the aperture has been changed an optical axis misalignment does not occur.

An eleventh form of the invention is in a focused ion beam apparatus characterized in that it comprises an ion source part having an ion source and a pullout electrode for producing an ion beam, a monitoring aperture which passes a central part having a high energy density of the ion beam and measures the current thereof, a charged particle optical system which includes a condenser lens, an aperture and an objective lens and makes the ion beam having passed through the monitoring aperture a focused ion beam, a deflecting electrode which scans the focused ion beam, XY direction moving means capable of moving the ion source in a direction intersecting orthogonally with the optical axis of the ion beam, and XY direction movement controlling means which controls the XY direction moving means with the current measured by the monitoring aperture and the overall ion beam quantity that the ion source produces as indices.

In this eleventh form, the movement of the ion source is controlled by the XY direction movement controlling means with the current value measured by the monitoring aperture and the overall ion beam quantity as indices. As a result, the center of the beam current density of the ion beam produced from the ion source and the center of the transmitting hole of the monitoring aperture coincide.

A twelfth form of the invention is in a focused ion beam apparatus according to the eleventh form, characterized in that during the movement of the ion source the XY direction movement controlling means monitors the current measured by the monitoring aperture and the overall ion beam quantity that the ion source produces and controls a voltage impressed on the pullout electrode so that this current becomes constant and controls the XY direction moving means so that this overall ion beam quantity becomes a minimum.

In this twelfth form, while the ion source is moved by the XY direction moving means, the voltage impressed on the pullout electrode is controlled so that the measured value of the beam current measured by the monitoring aperture becomes constant and the movement of the ion source is controlled by the XY direction movement controlling means so that the overall ion beam quantity becomes a minimum. As a result, a largest ion beam with which the overall ion beam quantity is smallest passes through the monitoring aperture; in other words, the center of the beam current density of the ion beam produced from the ion source coincides with the center of the transmitting hole of the monitoring aperture.

A thirteenth form of the invention is in a focused ion beam apparatus characterized in that it comprises an ion source part having an ion source and a pullout electrode for producing an ion beam, a monitoring aperture which passes a central part having a high energy density of the ion beam and measures the current thereof, a charged particle optical system which includes a condenser lens, an aperture and an objective lens and makes the ion beam having passed through the monitoring aperture a focused ion beam, a deflecting electrode which scans the focused ion beam, a Faraday cup which catches the focused ion beam and measures the beam current of that focused ion beam, XY direction moving means capable of moving the aperture in a direction intersecting orthogonally with the optical axis of the ion beam, and XY direction movement controlling means which controls the XY direction moving means with the current measured by the Faraday cup as an index.

In this thirteenth form, by the XY direction moving means, the XY direction movement controlling means is controlled with the beam current caught by the Faraday cup (the probe current) as an index. As a result, the center of the focused ion beam emitted through the transmitting hole of the monitoring aperture and focused by the charged particle optical system and the center of the transmitting hole of the aperture coincide.

A fourteenth form of the invention is in a focused ion beam apparatus according to the thirteenth form, characterized in that during the movement of the aperture the XY direction movement controlling means monitors the current measured by the Faraday cup and controls the XY direction moving means so that this current becomes a maximum.

In this fourteenth form, while the aperture is moved by the XY direction moving means, the XY direction movement controlling means carries out control so that the measured value of the beam current of the ion beam caught by the Faraday cup (the probe current) becomes a maximum. As a result, the center of the focused ion beam emitted through the transmitting hole of the monitoring aperture and focused by the charged particle optical system and the center of the transmitting hole of the aperture coincide.

A fifteenth form of the invention is in a focused ion beam apparatus characterized in that it comprises an ion source part having an ion source and a pullout electrode for producing an ion beam, a monitoring aperture which passes a central part having a high energy density of the ion beam and measures the current thereof, a charged particle optical system which includes a condenser lens, an aperture and an objective lens and makes the ion beam having passed through the monitoring aperture a focused ion beam, a deflecting electrode which scans the focused ion beam, a Faraday cup which catches the focused ion beam and measures the beam current of that focused ion beam, first XY direction moving means for moving the ion source in a direction intersecting orthogonally with the optical axis of the ion beam, first XY direction movement controlling means for controlling the first XY direction moving means with the current measured by the monitoring aperture and the overall ion beam quantity that the ion source produces as indices, second XY direction moving means capable of moving the aperture in a direction intersecting orthogonally with the optical axis of the ion beam, and second XY direction movement controlling means which controls the second XY direction moving means with the current measured by the Faraday cup as an index.

In this fifteenth form, the movement of the ion source is controlled by the first XY direction movement controlling means with the measured value of the beam current of the ion beam passing through the monitoring aperture and the overall ion beam quantity as indices. As a result, the center of the beam current density of the ion beam produced from the ion source and the center of the transmitting hole of the monitoring aperture coincide. Also, by control being carried out by the second XY direction movement controlling means with the measured value of the beam current of the ion beam caught by the Faraday cup as an index, the center of the focused ion beam emitted through the transmitting hole of the monitoring aperture and focused by the charged particle optical system and the center of the transmitting hole of the aperture coincide.

A sixteenth form of the invention is in a focused ion beam apparatus according to the fifteenth form, characterized in that during the movement of the ion source the first XY direction movement controlling means monitors the current measured by the monitoring aperture and the overall ion beam quantity that the ion source produces and controls a voltage impressed on the pullout electrode so that this current becomes constant and controls the first XY direction moving means so that this overall ion beam quantity becomes a minimum, and during the movement of the aperture the second XY direction movement controlling means monitors the current measured by the Faraday cup and controls the second XY direction moving means so that this current becomes a maximum.

In this sixteenth form, while the ion source is moved by the first XY direction moving means, the voltage impressed on the pullout electrode is controlled so that the measured value of the beam current of the ion beam passing through the monitoring aperture becomes constant and the movement of the ion source is controlled by the first XY direction movement controlling means so that the overall ion beam quantity becomes a minimum. As a result, a largest ion beam with which the overall ion beam quantity is smallest passes through the monitoring aperture; in other words, the center of the beam current density of the ion beam produced from the ion source coincides with the center of the transmitting hole of the monitoring aperture. Also, as a result of control being carried out by the second XY direction movement controlling means so that the measured value of the beam current of the ion beam caught by the Faraday cup becomes a minimum while the aperture is moved by the second XY direction moving means, the center of the focused ion beam emitted through the transmitting hole of the monitoring aperture and focused by the charged particle optical system and the center of the transmitting hole of the aperture coincide.

A seventeenth form of the invention is in a focused ion beam apparatus according to any of the eleventh through sixteenth forms, characterized in that it further comprises transmitting hole changing means capable of changing the dimension of a transmitting hole for passing the ion beam of the aperture.

By this means it is possible to realize optical axis alignment for each diameter of transmitting hole of the aperture, and even when the transmitting hole of the aperture has been changed an optical axis misalignment does not occur.

An eighteenth form of the invention is in a focused ion beam apparatus characterized in that it comprises an ion source part having an ion source and a pullout electrode for producing an ion beam, a charged particle optical system which includes a condenser lens, an aperture and an objective lens and makes the ion beam a focused ion beam, a deflecting electrode which scans the focused ion beam, a fixed aperture which is disposed anywhere between the ion source part and the deflecting electrode and passes at least a central part having a high energy density of the ion beam or the focused ion beam, a Faraday cup which catches the focused ion beam and measures the beam current of that focused ion beam, XY direction moving means capable of moving the ion source in a direction intersecting orthogonally with the optical axis of the ion beam, and XY direction movement controlling means for controlling the XY direction moving means with the current measured by the Faraday cup as an index so that this current becomes a maximum.

In this eighteenth form, the XY direction movement controlling means is controlled with the measured value of the beam current of the ion beam caught by the Faraday cup (the probe current) as an index. By this means it is possible to align a central part having a high energy density of the ion beam produced from the ion source and the center of the charged particle optical system.

A nineteenth form of the invention is in a focused ion beam apparatus according to the eighteenth form, characterized in that during the movement of the ion source the XY direction movement controlling means monitors the current measured by the Faraday cup and controls the XY direction moving means so that this current becomes a maximum.

In this nineteenth form, while the ion source is moved by the XY direction moving means, control is carried out by the XY direction movement controlling means so that the measured value of the beam current of the ion beam caught by the Faraday cup (the probe current) becomes a maximum. By this means it is possible to align a central part having a high energy density of the ion beam produced from the ion source and the center of the charged particle optical system.

A twentieth form of the invention is in a focused ion beam apparatus characterized in that it comprises an ion source part having an ion source and a pullout electrode for producing an ion beam, a charged particle optical system which includes a condenser lens, an aperture and an objective lens and makes the ion beam a focused ion beam, a deflecting electrode which scans the focused ion beam, a fixed aperture which is disposed any where between the ion source part and the deflecting electrode and passes at least a central part having a high energy density of the ion beam or the focused ion beam, a Faraday cup which catches the focused ion beam and measures the beam current of that focused ion beam, XY direction moving means capable of moving the aperture in a direction intersecting orthogonally with the optical axis of the ion beam, and XY direction movement controlling means for so controlling the XY direction moving means with the current measured by the Faraday cup as an index that this current becomes a maximum.

In this twentieth form, the XY direction movement controlling means is controlled with the measured value of the beam current of the ion beam caught by the Faraday cup (the probe current) as an index. As a result, the center of the focused ion beam ion beam focused by the charged particle optical system and the center of the transmitting hole of the aperture coincide.

A twenty-first form of the invention is in a focused ion beam apparatus according to the twentieth form, characterized in that during the movement of the aperture the XY direction movement controlling means monitors the current measured by the Faraday cup and controls the XY direction moving means so that this current becomes a maximum.

In this twenty-first form, while the aperture is moved by the XY direction moving means, control is carried out by the XY direction movement controlling means so that the measured value of the beam current of the ion beam caught by the Faraday cup (the probe current) becomes a maximum. As a result, the center of the focused ion beam focused by the charged particle optical system and the center of the transmitting hole of the aperture coincide.

A twenty-second form of the invention is in a focused ion beam apparatus characterized in that it comprises an ion source part having an ion source and a pullout electrode for producing an ion beam, a charged particle optical system which includes a condenser lens, an aperture and an objective lens and makes the ion beam a focused ion beam, a deflecting electrode which scans the focused ion beam, a fixed aperture which is disposed anywhere between the ion source part and the deflecting electrode and passes at least a central part having a high energy density of the ion beam or the focused ion beam, a Faraday cup which catches the focused ion beam and measures the beam current of that focused ion beam, first XY direction moving means capable of moving the ion source in a direction intersecting orthogonally with the optical axis of the ion beam, first XY direction movement controlling means for controlling the first XY direction moving means with the current measured by the Faraday cup as an index, second XY direction moving means for moving the aperture in a direction intersecting orthogonally with the optical axis of the ion beam, and second XY direction movement controlling means which controls the second XY direction moving means with the current measured by the Faraday cup as an index. In this twenty-second form, as a result of the XY direction movement controlling means being controlled with the measured value of the beam current of the ion beam caught by the Faraday cup (the probe current) as an index, a central part having a high energy density of the ion beam produced from the ion source and the center of the charged particle optical system coincide, and also, as a result of the second XY direction movement controlling means being controlled with the measured value of the beam current of the ion beam caught by the Faraday cup (the probe current) as an index, the center of the focused ion beam focused by the charged particle optical system and the center of the transmitting hole of the aperture coincide.

A twenty-third form of the invention is in a focused ion beam apparatus according to the twenty-second form, characterized in that during the movement of the ion source the first XY direction movement controlling means monitors the current measured by the Faraday cup and controls the XY direction moving means so that this current becomes a maximum and during the movement of the aperture the second XY direction movement controlling means monitors the current measured by the Faraday cup and controls the second XY direction moving means so that this current becomes a maximum.

In this twenty-third form, as a result of control being carried out by the XY direction movement controlling means so that the measured value of the beam current of the ion beam caught by the Faraday cup (the probe current) becomes a maximum while the ion source is moved by the first XY direction moving means, a central part having a high energy density of the ion beam produced from the ion source and the center of the charged particle optical system coincide, and also, as a result of control being carried out by the second XY direction movement controlling means so that the measured value of the beam current of the ion beam caught by the Faraday cup (the probe current) becomes a maximum while the aperture is moved by the second XY direction moving means, the center of the focused ion beam focused by the charged particle optical system and the center of the transmitting hole of the aperture coincide.

A twenty-fourth form of the invention is in a focused ion beam apparatus according to any of the eighteenth through twenty-third forms, characterized in that it further comprises transmitting hole changing means capable of changing the dimension of a transmitting hole of the aperture for passing the ion beam.

By this means it is possible to realize optical axis alignment for each diameter of transmitting hole of the aperture, and even when the transmitting hole of the aperture has been changed an optical axis misalignment does not occur.

DETAILED DESCRIPTION

The invention will now be described together with a practicing mode.

Figure 1:
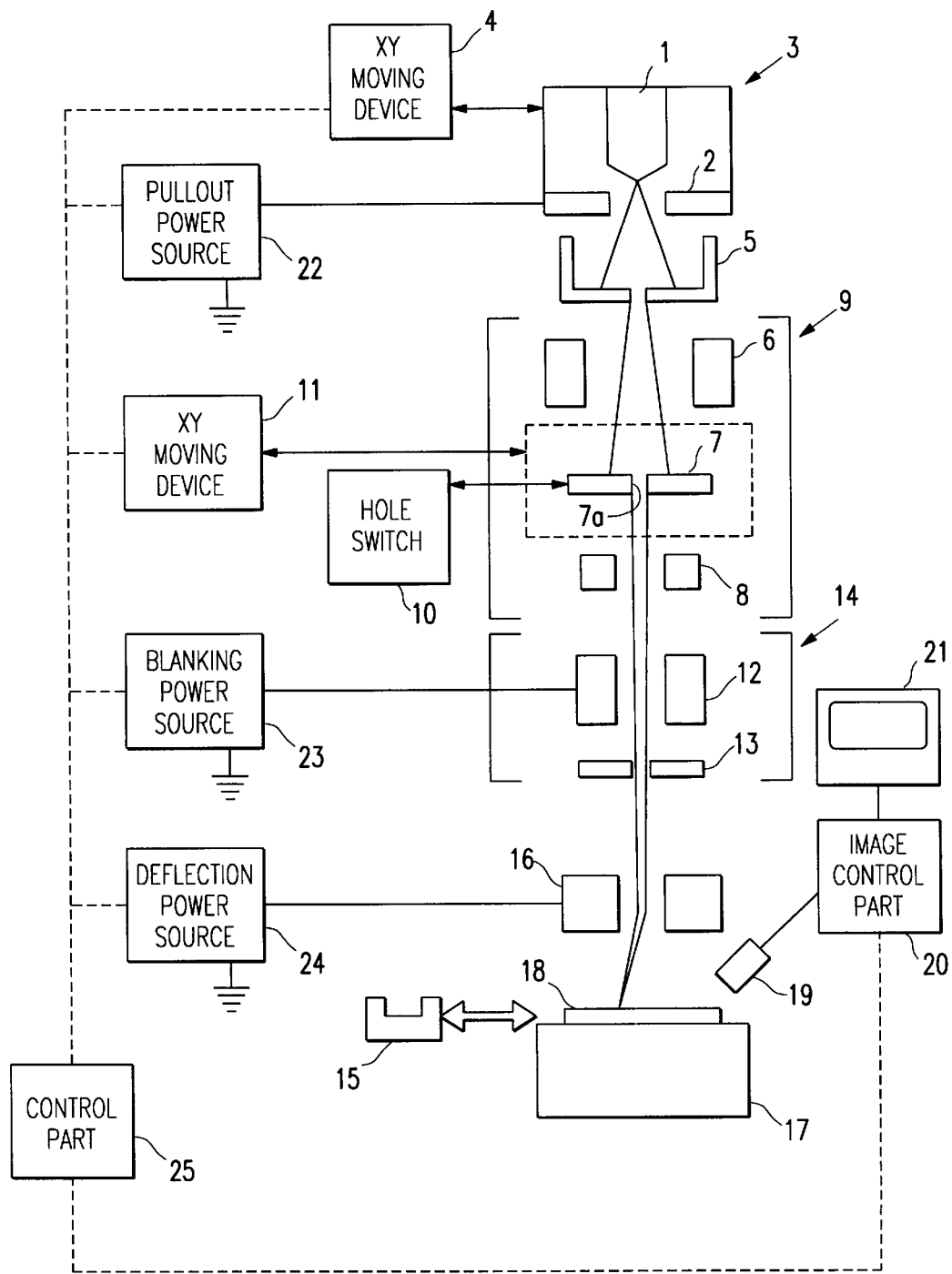
FIG. 1 is construction view showing the outline construction of a focused ion beam apparatus pertaining to a practicing mode of the invention.

FIG. 1 is a view showing the outline construction of a focused ion beam apparatus pertaining to a first practicing mode. As shown in FIG. 1, for example, an ion source part 3 having a liquid metal ion source 1 made of Ga or the like and a pullout electrode 2 is disposed mounted on an XY direction moving device 4 movably in XY directions that are two directions intersecting orthogonally with a produced beam. A monitoring aperture 5 which passes only the central part, having a high energy density, of a high-intensity ion beam B1 produced from the ion source part 3 and measures the electric current of that captured ion beam is disposed on the beam radiation side of the ion source part 3. Also, a charged particle optical system 9 made up of a condenser lens 6, an aperture 7 and an objective lens 8 is disposed on the beam emission side of the monitoring aperture 5, and the high-intensity ion beam B1 emitted from the ion source 1 is focused by the charged particle optical system 9 and becomes a focused ion beam B2.

Here, the aperture 7 has a plurality of transmitting holes 7a whose diameter dimensions differ, and can be switched by a transmitting hole switching device 10. That is, the aperture 7 is changeable by the transmitting hole switching device 10 to a plurality of transmitting holes 7a whose diameter dimensions differ in this example, the diameter dimensions of the transmitting holes 7a are made changeable by a member having a plurality of transmitting holes 7a whose diameter dimensions differ being made to slide, but alternatively the diameter dimension of a single transmitting hole 7a may be made changeable continuously or stepwise. Thus the construction of this transmitting hole switching device 10 is not particularly limited, but as a specific example for example the construction disclosed in Japanese Unexamined Patent Publication No. S.62-223756 can be given.

Also, the aperture 7 has the radial direction position of each transmitting hole 7a movable by an XY direction moving device 11.

On the beam emission side of the charged particle optical system 9, blanking means 14 made up of a blanking electrode 12 and a blanking aperture 13 is provided, and performs turning ON/OFF of the focused ion beam. That is, when turning the focused ion beam B2 OFF, it impresses a voltage on the blanking electrode 12 and causes it to deflect the focused ion beam B2 and thereby blocks it with the blanking aperture 13. The disposition of the blanking electrode 12 and the blanking aperture 13 is not limited to this, and for example they may alternatively be disposed above the charged particle optical system 9.

Also, a deflecting electrode 16 for scanning the focused ion beam B2 having passed through the blanking aperture 13 to a desired position is disposed on the beam emission side of the blanking aperture 13, and the focused ion beam B2 scanned by the deflecting electrode 16 is radiated in a desired position on a sample 18 on a sample stage 17.

A detector 19 for detecting secondary charged particles emitted from the surface of the sample 18 onto which the focused ion beam B2 has been radiated is disposed above the sample stage 17, and an image control part 20 which amplifies the detection signal and finds the plane strength distribution of the secondary charged particles and an image display device 21 which displays a pattern formed on the sample surface on the basis of a plane strength distribution signal from this image control part 20 are connected to this detector 19.

Also, a Faraday cup 15 positionally interchangeable with the sample stage 17 is disposed at the side of the sample stage 17. The Faraday cup 15 receives the focused ion beam B2 irradiation in place of the sample 18 and measures the beam current thereof.

To the above-mentioned pullout electrode 2, blanking electrode 12 and deflecting electrode 16 are respectively connected a pullout power source 22, a blanking power source 23 and a deflecting power source 24 for impressing desired voltages on each, and a control part 25 consisting of a computer system which performs overall control of the whole of this kind of focused ion beam apparatus and can individually control the XY direction moving device 4, the transmitting hole switching device 10, the XY direction moving device 11 and the above-mentioned electrodes 22 through 24 and so on is also provided. With this kind of focused ion beam apparatus, by the ion beam B1 pulled out from the ion source part 3 being focused by means of the charged particle optical system 9 and scanned by means of the deflecting electrode 16 and radiated onto the sample 18, it is possible to carry out working of the sample 18. Also, although it is not shown in this example, by providing a gas radiation nozzle in the vicinity of the sample 18 and supplying gas through the gas radiation nozzle simultaneously with radiating of the focused ion beam B2, it is possible to carry out CVD film formation locally.

Also, when carrying out this kind of working, the working state can be observed using the image display device 21. Although it is not shown in this example, the surface of the sample 18 may be irradiated using for example ordinary illumination so that it is possible to observe the sample surface with an optical microscope at the same time.

An optical axis adjustment method of this kind of focused ion beam apparatus will now be described.

First, optical axis adjustment of the ion source part 3 will be described. While the ion source part 3 is moved in the X direction and the Y direction respectively by means of the XY direction moving device 4 the beam current measured by the monitoring aperture 5 and the overall ion beam quantity produced from the ion source part 3 are measured, and the ion source part 3 is fixed at a point at which this overall ion beam quantity has become a minimum.

Figure 2:
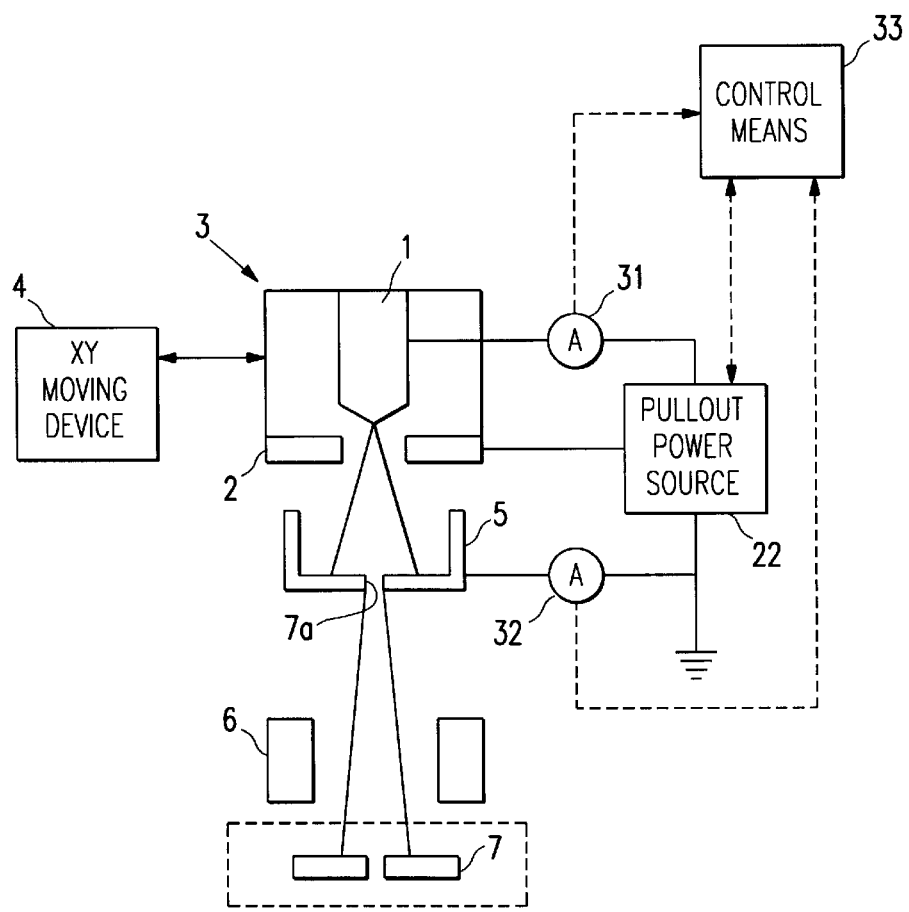
FIG. 2 is a view for explaining a method of position adjustment of an ion source.

A detailed description of this adjustment will be given with reference to FIG. 2. In the ion source part 3, wherein the ion beam B1 is pulled out from the ion source 1 by a voltage being impressed on the pullout electrode 2, an ammeter 31 measuring the emission current corresponding to the whole of the ion beam produced from the ion source I is connected to the ion source 1, and to the monitoring aperture 5 is connected an ammeter 32 measuring the beam current caught by the part other than a transmitting hole 5a thereof. Controlling means 33, while causing the ion source part 3 to move by way of the XY direction moving device 4, feedback controls the voltage impressed on the pullout electrode 2 so that the beam current of the ion beam caught by the monitoring aperture 5, i.e. the value measured by the ammeter 32, becomes constant and controls the XY direction moving device 4 so that the emission current (the current measured by the ammeter 31) corresponding to the overall ion beam quantity becomes a minimum. This control carried out by the controlling means 33 is executed by way of the control part 25. When this kind of control is carried out, a largest ion beam with which the overall ion beam quantity is smallest passes through the monitoring aperture 5; in other words, the center of the beam current density of the ion beam produced from the ion source 1 coincides with the center of the transmitting hole 5a of the monitoring aperture 5.

In this kind of focused ion beam apparatus, generally, the voltage impressed on the pullout electrode 2 is feedback controlled so that the current value of the ammeter 32 becomes constant, but it is possible to provide the control of this practicing mode additionally to this. Of course, the construction of this practicing mode may be provided for axis alignment, and in any case, with this practicing mode, for axis alignment, all that is necessary is to, with the voltage impressed on the pullout electrode 2 controlled so that the current value of the ammeter 32 is constant, while moving the ion source part 3, decide the fixing position of the ion source part 3 so that the emission current measured by the ammeter 31 becomes a minimum.

Here, the XY direction moving device 4 is not particularly limited as long as it is one with which it is possible to move the ion source part 1 finely in at least two directions, and for example the X direction movement and the Y direction movement may alternatively be respectively carried out by independent linear actuators. Also, although the XY direction moving device 4 may be one automatically movable by control of the control part 25, it may also be one finely movable by hand. For example, as a specific example, the device mentioned in Japanese Unexamined Patent Publication No. H.3-24249 may be given.

Also, in this practicing mode the ion source part 3 was moved, but of course it is clear that the same effects can also be provided by moving just the ion source 1. The construction of the ion source part 3 also is not limited to one consisting of an ion source and a pullout electrode only and for example may have a control electrode for limiting the production of the ion beam besides the pullout electrode, and in this case also the whole ion source part may be moved or just the ion source, or just the ion source and the control electrode may be moved. In the practicing mode in the following also, although it is described with the ion source part 3 being one which moves, it is the same in the following.

Next, another method of optical axis adjustment of the ion source part 3 will be described. The example described above is one in which optical axis adjustment of the ion source part 3 and the monitoring aperture 5 is carried out, but in this case it is optical axis alignment of the ion source part 3 and the charged particle optical system 9. That is, in this case, while moving the ion source part 3 by way of the XY direction moving device 4, the position of the ion source part 3 is adjusted so that the beam current of the ion beam caught by the Faraday cup 15, i.e. the probe current, becomes a maximum.

Figure 3:
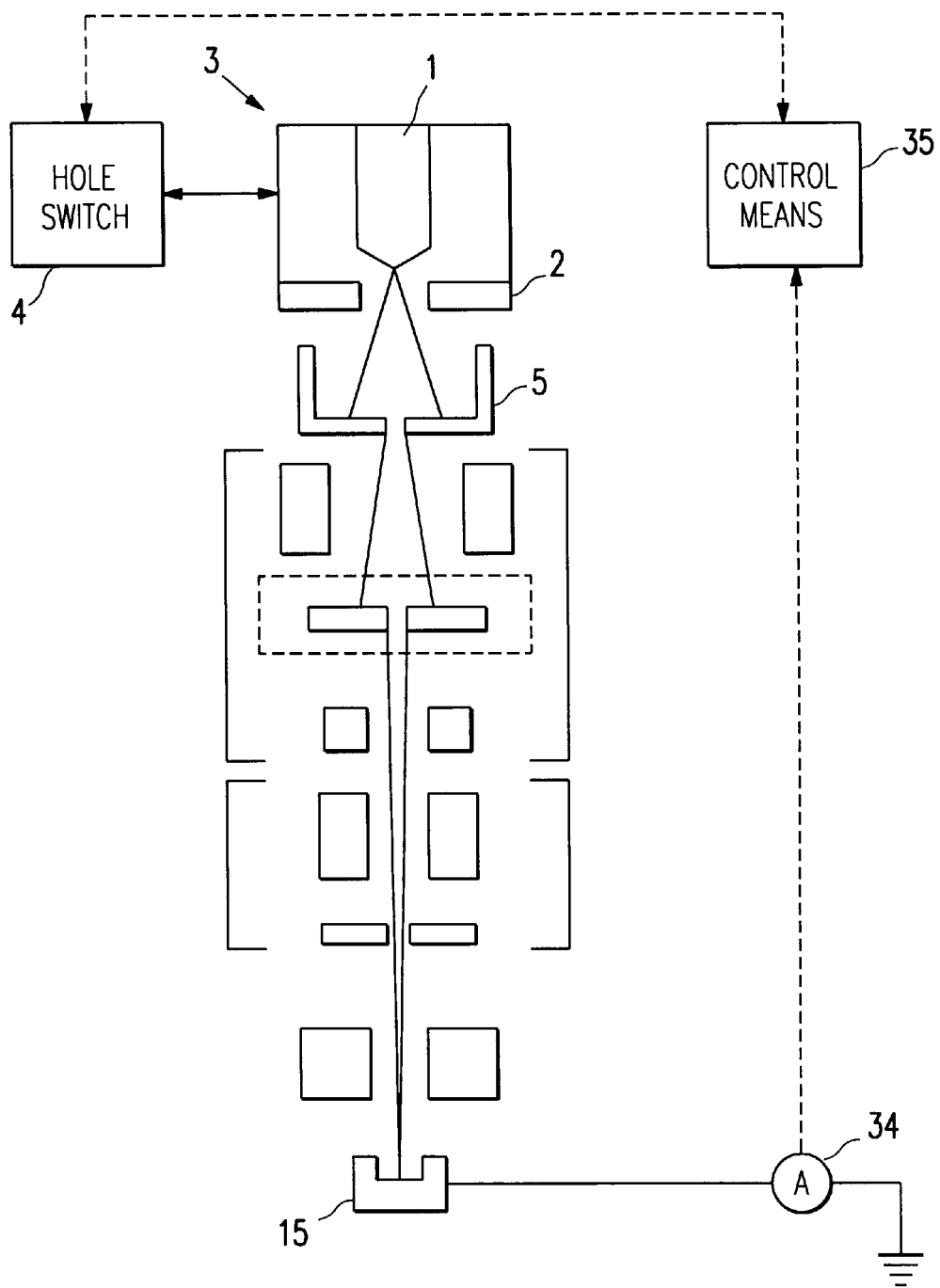
FIG. 3 is a view for explaining another method of position adjustment of an ion source.

A detailed description of this adjustment will now be described with reference to FIG. 3. As shown in FIG. 3, an ammeter 34 which measures the beam current of the focused ion caught by the Faraday cup 15 is connected to the Faraday cup 15, and controlling means 35, while moving the ion source part 3 by way of the XY direction moving device 4, controls the XY direction moving device 4 so that the beam current of the ion beam caught by the Faraday cup 15 (the probe current), i.e. the measured value of the ammeter 34, becomes a maximum. This control executed by the controlling means 35 is carried out by way of the control part 25. When this kind of control is carried out, it is possible to align the central part having a high energy density of the ion beam produced from the ion source 1 and the center of the charged particle optical system 9.

Next, optical axis alignment of the charged particle optical system 9 and particularly of the aperture 7 will be described. In this case, while the aperture 7 is moved in the X direction and the Y direction respectively by means of the XY direction moving device 10 the probe current is measured by the Faraday cup 15 and the aperture 7 is fixed at the point at which this probe current becomes a maximum.

Figure 4:
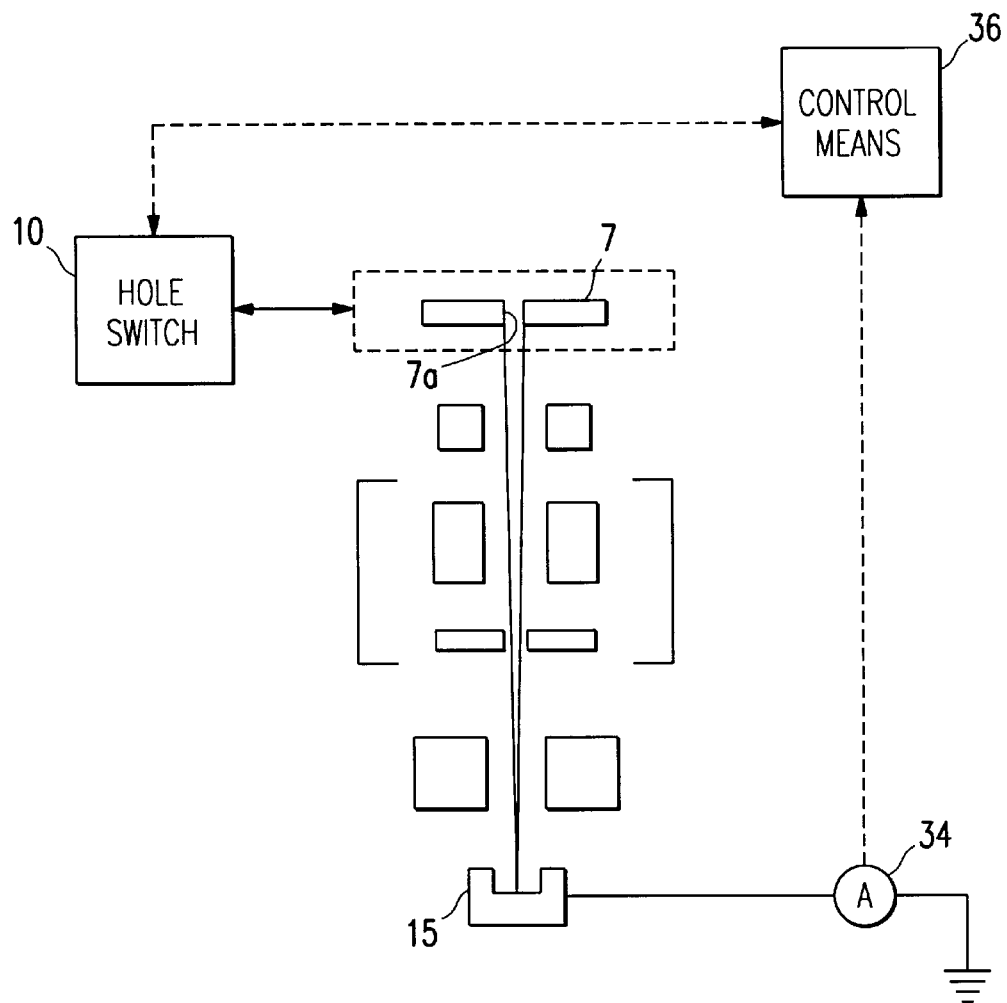
FIG. 4 is a view for explaining a method of position adjustment of an aperture.

A detailed description of this adjustment will now be described with reference to FIG. 4. As shown in FIG. 4, an ammeter 34 which measures the beam current of the focused ion beam caught by the Faraday cup 15 is connected to the Faraday cup 15, and controlling means 36, while moving the aperture 7 by way of the XY direction moving device 10, controls the XY direction moving device 4 so that the beam current of the ion beam caught by the Faraday cup 15 (the probe current), i.e. the measured value of the ammeter 34, becomes a maximum. This control executed by the controlling means 36 is carried out by way of the control part 25. When this kind of control is carried out, the center of the beam current density of the ion beam emitted through the transmitting hole 5a of the monitoring aperture 5 and the center of the transmitting hole 7a of the aperture 7 coincide. Also, with the practicing mode described above, the aperture 7 has the diameter of the transmitting hole 7a changeable by means of the transmitting hole switching device 10, but this kind of optical axis alignment can be carried out for each transmitting hole, and by it being carried out when the diameter of the transmitting hole 7a has been changed it becomes possible to use it with the optical axis adjusted at all times.

Because the optical axis adjustments described above can all be carried out with current measurement values as determination materials, automatic adjustment is possible by computer control, and there is the merit that compared to methods which rely on the experience and skill of a worker it is possible to carry out the best axis alignment rapidly and objectively at all times. Also, because it is possible to carry out optical axis alignment using objective measured values as indices, there is also the merit that computer-based automation becomes possible.

Figure 5A:
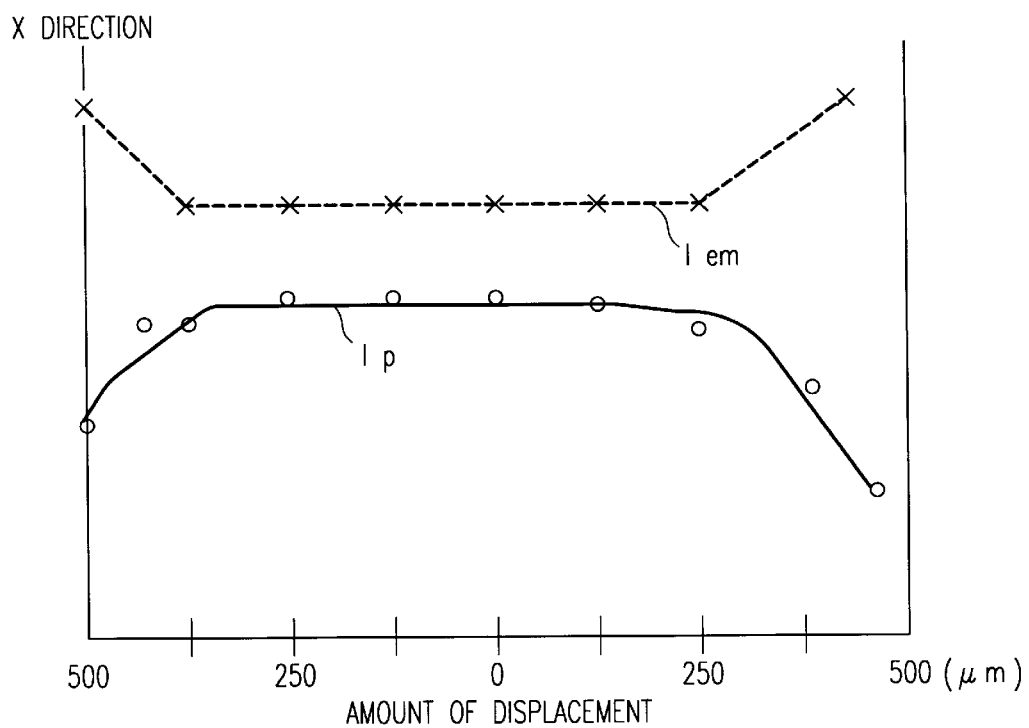
FIG. 5a is a view showing tests results of the invention.
Figure 5B:
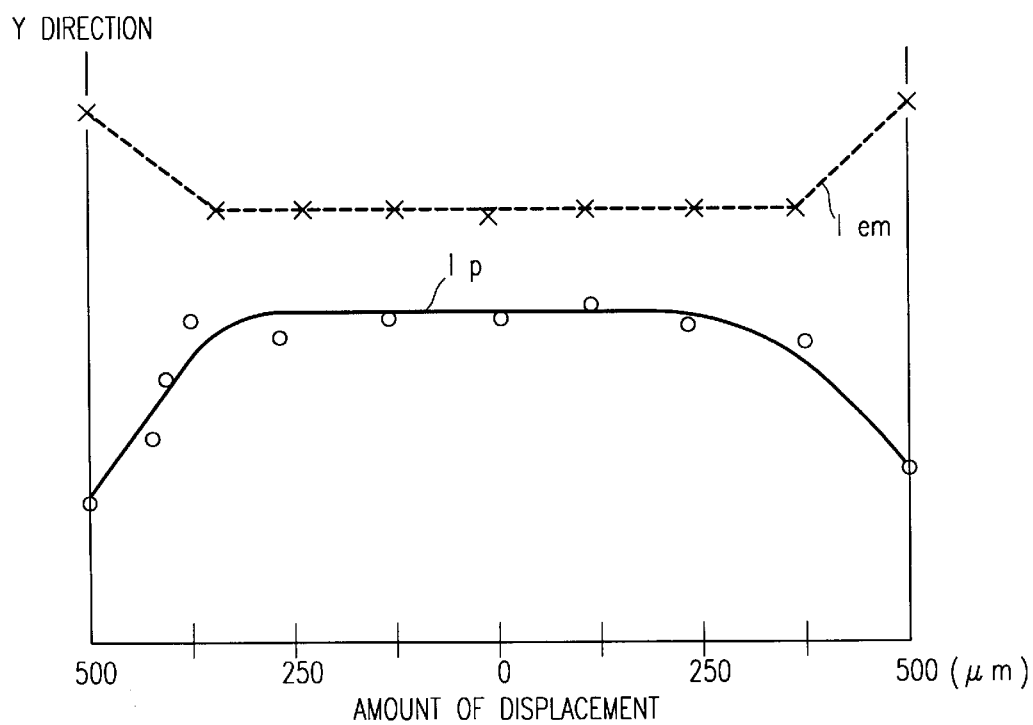
FIG. 5b is a construction view showing the outline construction of a focused ion beam apparatus pertaining to another practicing mode of the invention.

Results obtained when change of the emission current (Iem) and probe current (Ip) of when in the focused ion beam apparatus described above the ion source part 3 is moved in the X-axis direction ((a)) and in the Y-axis direction ((b)) from a state wherein the optical axis is aligned was measured are shown in FIG. 5. The diameter of the transmitting hole 5a of the monitoring aperture 5 of this case is 500 μm. As shown in these results, the emission current and the probe current both do not change markedly until 250 μm, but this may be reflecting the diameter of the transmitting hole 5a of the monitoring aperture 5; in any case, it is clear that when optical axis alignment is carried out with the emission current or the probe current as an index as described above, when the diameter of the transmitting hole 7a is 500μm, it is possible to perform optical axis alignment with an accuracy of about ±300 to 400 μm. Therefore, when a still smaller aperture is used, it is possible to realize highly accurate optical axis alignment.

Also, when the kind of measured values of FIG. 5 are obtained, the method for carrying out optical axis alignment automatically by means of computer processing is not particularly limited, but describing taking as an example the overall ion beam quantity, for example by the method of performing position alignment with the midway point between the spots at +10% from the minimum ion beam quantity determined to be the center it is possible to carry out automation very easily.

The optical axis adjustment method described above was described with an example wherein it is applied to the focused ion beam apparatus shown in FIG. 1, but needless to say it can be applied to focused ion beam apparatuses of various constructions. For example, when carrying out optical axis alignment using the emission current as an index, it may be a construction not having a Faraday cup. Also, when the emission current is not used as an index, the above-mentioned monitoring aperture 5 may be an ordinary fixed aperture which cannot measure beam current, or it may be one wherein essentially an aperture does not exist at the exit of the ion source part. To carry out the optical axis adjustment described above in a case wherein essentially an aperture does not exist at the exit of the ion source part, it is necessary to provide a fixed aperture anywhere between the charged particle optical system and the deflecting electrode. This fixed aperture is one having a transmitting hole substantially the same as the diameter of the focused ion beam or of a smaller diameter than that, and it is necessary for the center of this transmitting hole to be disposed so that it coincides with the optical axis of the charged particle optical system.

Thus, this invention can be applied in various combinations. For example, the apparatus shown in FIG. 6 is a focused ion beam apparatus of a construction similar to FIG. 1 except that a fixed aperture 45 is disposed in place of the above-mentioned monitoring aperture 5, and in this case also it is possible to carry out the optical axis alignments described with the above-mentioned FIG. 3 and FIG. 4 in the same way.

As described above, with this invention, because it is possible to realize optical axis alignment rapidly and objectively with an emission current or a probe current as an index, the axis alignment work of for example when replacing an ion source of a focused ion beam apparatus can be made easy, and also, because optical axis alignment can be carried out with objective measured values as indices, there is the effect that it is possible to carry out computer-based automation easily.

What is claimed is:

1. A method of adjusting the optical axis of a focused ion beam apparatus having an ion source part comprised of an ion source for producing an ion beam and a pullout electrode, a monitoring aperture for passing a central part having a high energy density of the ion beam and measuring the beam current of the caught ion beam, a charged particle optical system including a condenser lens, an aperture and an objective lens for producing a focused ion beam from the ion beam passing through the monitoring aperture, and a deflecting electrode for scanning the focused ion beam, said method characterized by the steps of moving the ion source in a direction intersecting orthogonally with the optical axis of the ion beam, monitoring the current measured by the monitoring aperture and the overall ion beam quantity produced from the ion source, and controlling a voltage impressed on the pullout electrode so that the current becomes constant and the position of the ion source is adjusted to minimize the overall ion beam quantity.

2. A method of adjusting the optical axis of a focused ion beam apparatus having an ion source part having an ion source for producing an ion beam and a pullout electrode, a monitoring aperture for passing a central part having a high energy density of the ion beam and measuring the current thereof, a charged particle optical system including a condenser lens, an aperture and an objective lens for producing a focused ion beam from the ion beam passing through the monitoring aperture, a deflecting electrode for scanning the focused ion beam, and a Faraday cup for catching the focused ion beam and measuring the beam current of the focused ion beam, said method characterized by the steps of moving the aperture in a direction intersecting orthogonally with the optical axis of the ion beam, monitoring the current measured by the Faraday cup and adjusting the position of the aperture to maximize the current.

3. An optical axis adjustment method according to claim 2, wherein the dimension of a transmitting hole of the aperture passing the ion beam is changeable, and further characterized by the step of performing positional adjustment of the aperture for the transmitting hole of each dimension.

4. A method of adjusting the optical axis of a focused ion beam apparatus having an ion source part having an ion source for producing an ion beam and a pullout electrode, a monitoring aperture which passes a central part having a high energy density of the ion beam and measures the current thereof, a charged particle optical system which includes a condenser lens, an aperture and an objective lens and makes the ion beam having passed through the monitoring aperture a focused ion beam, a deflecting electrode which scans the focused ion beam, and a Faraday cup which catches the focused ion beam and measures the beam current of that focused ion beam, characterized in that it comprises a step of, while moving the ion source in a direction intersecting orthogonally with the optical axis of the ion beam, monitoring the current measured by the monitoring aperture and the overall ion beam quantity that the ion source produces and controlling a voltage impressed on the pullout electrode so that this current becomes constant and adjusting the position of the ion source so that this overall ion beam quantity becomes a minimum, and a step of, while moving the aperture in a direction intersecting orthogonally with the optical axis of the ion beam, monitoring the current measured by the Faraday cup and adjusting the position of the aperture so that this current becomes a maximum.

5. A method according to claim 4, characterized in that the dimension of a transmitting hole of the aperture for passing the ion beam is changeable and positional adjustment of the aperture is carried out for a transmitting hole of each dimension.

6. A method of adjusting the optical axis of a focused ion beam apparatus having an ion source and a pullout electrode for producing an ion beam, a charged particle optical system including a condenser lens, an aperture and an objective lens and for producing a focused ion beam from the ion beam, a deflecting electrode for scanning the focused ion beam, a fixed aperture between the ion source part and the deflecting electrode and passing at least a central part having a high energy density of the ion beam or the focused ion beam, and a Faraday cup for catching the focused ion beam and measuring the beam current of the focused ion beam, said method characterized by the steps of moving the ion source in a direction intersecting orthogonally with the optical axis of the ion beam, monitoring the current measured by the Faraday cup and adjusting the position of the ion source to maximize the current.

7. A method of adjusting the optical axis of a focused ion beam apparatus having an ion source part having an ion source and a pullout electrode for producing an ion beam, a charged particle optical system including a condenser lens, an aperture and an objective lens and for producing a focused ion beam from the ion beam, a deflecting electrode for scanning the focused ion beam, a fixed aperture disposed between the ion source part and the deflecting electrode and passing at least a central part having a high energy density of the ion beam or the focused ion beam, and a Faraday cup for catching the focused ion beam and measuring the beam current of the focused ion beam, said method characterized by the steps of moving the aperture in a direction intersecting orthogonally with the optical axis of the ion beam, monitoring the current measured by the Faraday cup and adjusting the position of the aperture to maximize the current.

8. An optical axis adjustment method according to claim 7, wherein the diameter of a transmitting hole of the aperture for passing the ion beam is changeable, and further characterized by the step of performing positional adjustment of the aperture for a transmitting hole of each dimension.

9. A method of adjusting the optical axis of a focused ion beam apparatus having an ion source part having an ion source and a pullout electrode for producing an ion beam, a charged particle optical system including a condenser lens, an aperture and an objective lens for producing a focused ion beam from the ion beam a deflecting electrode for scanning the focused ion beam, a fixed aperture disposed between the ion source part and the deflecting electrode and passing at least a central part having a high energy density of the ion beam or the focused ion beam, and a Faraday cup for catching the focused ion beam and measuring the beam current of the focused ion beam, said method characterized by the steps of moving the ion source in a direction intersecting orthogonally with the optical axis of the ion beam, monitoring the current measured by the Faraday cup and adjusting the position of the ion source so that the current is maximized, and while the aperture is moved in a direction intersecting orthogonally with the optical axis of the ion beam, monitoring the current measured by the Faraday cup and adjusting the position of the aperture to maximize the current.

10. An optical axis adjustment method according to claim 9, wherein the diameter of a transmitting hole of the aperture for passing the ion beam is changeable and further characterized by the step of performing positional adjustment of the aperture for a transmitting hole of each dimension.

11. A focused ion beam apparatus characterized in that it comprises an ion source part having an ion source and a pullout electrode for producing an ion beam, a monitoring aperture which passes a central part having a high energy density of the ion beam and measures the current thereof, a charged particle optical system which includes a condenser lens, an aperture and an objective lens and makes the ion beam having passed through the monitoring aperture a focused ion beam, a deflecting electrode which scans the focused ion beam, XY direction moving means for moving the ion source in a direction intersecting orthogonally with the optical axis of the ion beam, and XY direction movement controlling means which controls the XY direction moving means with the current measured by the monitoring aperture and the overall ion beam quantity that the ion source produces as indices.

12. A focused ion beam apparatus according to claim 11, characterized in that during the movement of the ion source the XY direction movement controlling means monitors the current measured by the monitoring aperture and the overall ion beam quantity that the ion source produces and controls a voltage impressed on the pullout electrode so that this current becomes constant and controls the XY direction moving means so that this overall ion beam quantity becomes a minimum.

13. A focused ion beam apparatus according to claim 11, characterized in that it further comprises transmitting hole changing means for changing the dimension of a transmitting hole of the aperture for passing the ion beam.

14. A focused ion beam apparatus characterized in that it comprises an ion source part having an ion source and a pullout electrode for producing an ion beam, a monitoring aperture which passes a central part having a high energy density of the ion beam and measures the current thereof, a charged particle optical system which includes a condenser lens, an aperture and an objective lens and makes the ion beam having passed through the monitoring aperture a focused ion beam, a deflecting electrode which scans the focused ion beam, a Faraday cup which catches the focused ion beam and measures the beam current of that focused ion beam, XY direction moving means for moving the aperture in a direction intersecting orthogonally with the optical axis of the ion beam, and XY direction movement controlling means which controls the XY direction moving means with the current measured by the Faraday cup as an index.

15. A focused ion beam apparatus according to claim 14, characterized in that during the movement of the aperture the XY direction movement controlling means monitors the current measured by the Faraday cup and controls the XY direction moving means so that this current becomes a maximum.

16. A focused ion beam apparatus characterized in that it comprises an ion source part having an ion source and a pullout electrode for producing an ion beam, a monitoring aperture which passes a central part having a high energy density of the ion beam and measures the current thereof, a charged particle optical system which includes a condenser lens, an aperture and an objective lens and makes the ion beam having passed through the monitoring aperture a focused ion beam, a deflecting electrode which scans the focused ion beam, a Faraday cup which catches the focused ion beam and measures the beam current of that focused ion the first XY direction moving means for moving the ion source in a direction intersecting orthogonally with the optical axis of the ion beam, first XY direction movement controlling means for controlling the first XY direction moving means with the current measured by the monitoring aperture and the overall ion beam quantity that the ion source produces as indices, second XY direction moving means for moving the aperture in a direction intersecting orthogonally with the optical axis of the ion beam, and second XY direction movement controlling means which controls the second XY direction moving means with the current measured by the Faraday cup as an index.

17. A focused ion beam apparatus according to claim 16, characterized in that during the movement of the ion source the first XY direction movement controlling means monitors, the current measured by the monitoring aperture and the overall ion beam quantity that the ion source produces and controls a voltage impressed on the pullout electrode so that this current becomes constant and controls the first XY direction moving means so that this overall ion beam quantity becomes a minimum, and during the movement of the aperture the second XY direction movement controlling means monitors the current measured by the Faraday cup and controls the second XY direction moving means so that this current becomes a maximum.

18. A focused ion beam apparatus characterized in that it comprises an ion source part having an ion source and a pullout electrode for producing an ion beam, a charged particle optical system which includes a condenser lens, an aperture and an objective lens and focuses the ion beam, a deflecting electrode which scans the focused ion beam, a fixed aperture which is disposed between the ion source part and the deflecting electrode and passes at least a central part having a high energy density of the ion beam or the focused ion beam, a Faraday cup which catches the focused ion beam and measures the beam current of that focused ion beam, XY direction moving means for moving the ion source in a direction intersecting orthogonally with the optical axis of the ion beam, and XY direction movement controlling means for controlling the XY direction moving means with the current measured by the Faraday cup as an index so that this current becomes a maximum.

19. A focused ion beam apparatus according to claim 18, characterized in that during the movement of the ion source the XY direction movement controlling means monitors the current measured by the Faraday cup and controls the XY direction moving means so that this current becomes a maximum.

20. A focused ion beam apparatus according to claim 18, characterized in that it further comprises transmitting hole changing means for changing the dimension of a transmitting hole of the aperture for passing the ion beam.

21. A focused ion beam apparatus characterized in that it comprises an ion source part having an ion source and a pullout electrode for producing an ion beam, a charged particle optical system which includes a condenser lens, an aperture and an objective lens and focuses the ion beam, a deflecting electrode which scans the focused ion beam, a fixed aperture which is disposed between the ion source part and the deflecting electrode and passes at least a central part having a high energy density of the ion beam or the focused ion beam, a Faraday cup which catches the focused ion beam and measures the beam current of that focuses ion beam, XY direction moving means for moving the aperture in a direction intersecting orthogonally with the optical axis of the ion beam, and XY direction movement controlling means for controlling the XY direction moving means with the current measured by the Faraday cup as an index so that this current becomes a maximum.

22. A focused ion beam apparatus according to claim 21, characterized in that during the movement of the aperture the XY direction movement controlling means monitors the current measured by the Faraday cup and controls the XY direction moving means so that this current becomes a maximum.

23. A focused ion beam apparatus characterized in that it comprises an ion source part having an ion source and a pullout electrode for producing an ion beam, a charged particle optical system which includes a condenser lens, an aperture and an objective lens and focuses the ion beam, a deflecting electrode which scans the focused ion beam, a fixed aperture which is disposed between the ion source part and the deflecting electrode and passes at least a central part having a high energy density of the ion beam or the focused ion beam, a Faraday cup which catches the focused ion beam and measures the beam current of that focused ion beam, first XY direction moving means for moving the ion source in a direction intersecting orthogonally with the optical axis of the ion beam, first XY direction movement controlling means for controlling the first XY direction moving means with the current measured by the Faraday cup as an index, second XY direction moving means for moving the aperture in a direction intersecting orthogonally with the optical axis of the ion beam, and second XY direction movement controlling means for controlling the second XY direction moving means with the current measured by the Faraday cup as an index.

24. A focused ion beam apparatus according to claim 23, characterized in that during the movement of the ion source the first XY direction movement controlling means monitors the current measured by the Faraday cup and controls the XY direction moving means so that this current becomes a maximum and during the movement of the aperture the second XY direction movement controlling means monitors the current measured by the Faraday cup and controls the second XY direction moving means so that this current becomes a maximum.

* * * * *